United States Patent
Lee et al.

(10) Patent No.: US 8,656,318 B2
(45) Date of Patent: Feb. 18, 2014

(54) SYSTEM AND METHOD FOR COMBINED INTRAOVERLAY METROLOGY AND DEFECT INSPECTION

(75) Inventors: Hsin-Chang Lee, Hsin-Chu Xian (TW);
Chia-Jen Chen, Hsinchu County (TW);
Yeh Lee-Chih, Hsinchu County (TW);
Sheng-Chi Chin, Hsinchu (TW);
Ting-Hao Hsu, Hsinchu (TW); Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/464,116

(22) Filed: May 4, 2012

(65) Prior Publication Data
US 2013/0298088 A1 Nov. 7, 2013

(51) Int. Cl.
*G06F 17/50* (2006.01)

(52) U.S. Cl.
USPC ............................................. 716/52; 716/51

(58) Field of Classification Search
USPC .................................................... 716/51, 52
See application file for complete search history.

(56) References Cited

U.S. PATENT DOCUMENTS 7,231,628 B2 * 6/2007 Pack et al. ..................... 716/52
7,906,252 B2 3/2011 Lee et al.

* cited by examiner

*Primary Examiner* — Vuthe Siek
(74) *Attorney, Agent, or Firm* — Haynes and Boone, LLP (57) ABSTRACT

A method and system for measuring layer overlay and for inspecting a mask for defects unrelated to overlay utilizing a singe comprehensive tool is disclosed. An exemplary method includes receiving a mask design database that corresponds to a mask and has a die area with a mask database feature. A mask image of the mask is received, and a comprehensive inspection system compares the mask image to the mask design database in order to detect mask defects that are not related to layer alignment. The system produces mask defect information corresponding to the mask defects. The comprehensive inspection system also compares the mask image to the mask design database to determine a database-to-mask offset. From the database-to-mask offset, a mask overlay characteristic is determined.

19 Claims, 8 Drawing Sheets

SYSTEM AND METHOD FOR COMBINED INTRAOVERLAY METROLOGY AND DEFECT INSPECTION

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

For example, mask overlay has become increasingly important as device size shrinks. ICs are typically assembled by layering features on a semiconductor wafer using a set of photolithographic masks. Each mask in the set has a pattern formed by transmissive or reflective regions. During a photolithographic exposure, radiation such as ultraviolet light passes through or reflects off the mask before striking a photoresist coating on the wafer. The mask transfers the pattern onto the photoresist, which is then selectively removed to reveal the pattern. The wafer then undergoes processing steps that take advantage of the shape of the remaining photoresist to create circuit features on the wafer. When the processing steps are complete, photoresist is reapplied and wafer is exposed using the next mask. In this way, the features are layered to produce the final circuit.

Regardless of whether a mask is error-free, if all or part of the mask is not aligned properly, the resulting features may not align correctly with those on adjoining layers. This misalignment can result in reduced device performance or complete device failure. Conventional overlay metrology tools are used to check mask alignment but have not been satisfactory in all regards. The tools are expensive, slow, and are limited in their ability to detect variations within the die area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to mask manufacturing and inspection systems, and more particularly, to a method and apparatus for performing overlay metrology and defect inspection using a single inspection tool.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
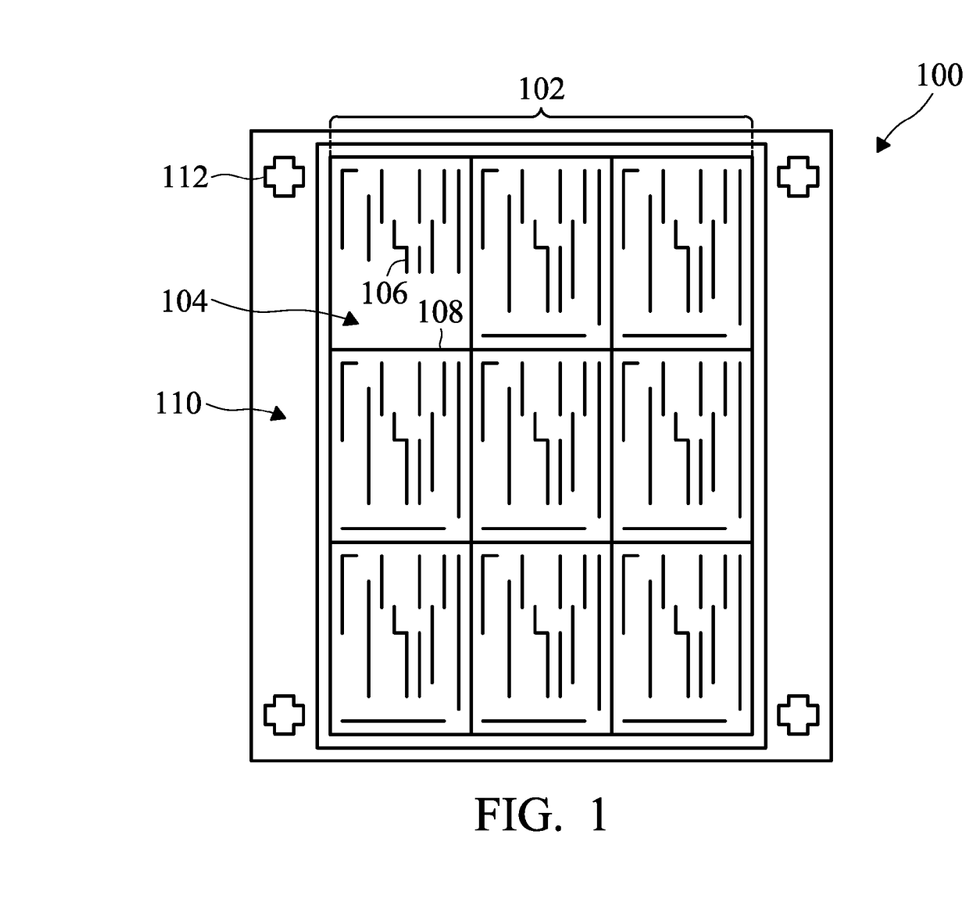
FIG. 1 is a diagrammatic top view of a mask for IC manufacturing according to various aspects of the present disclosure.

FIG. 1 is a diagrammatic top view of a mask 100 for IC manufacturing. The mask 100 may include a substrate, an absorption layer, one or more attenuating layers, and/or one or more reflective layers. Suitable substrate materials include fused silica, fused quartz, calcium fluoride ($CaF_2$), and/or other suitable material. The absorption layer may include chromium (CR), MoSi, and/or other suitable materials. Typically, the absorption layer is shaped using a mask writing technique such as electron beam writing, ion beam writing, photolithography such as binary photolithography or phase shift photolithography coupled with etching such as wet or dry etching, and can be shaped using an alternative mask writing technique. The mask 100 may include attenuating layers formed from such materials as metal silicide, metal nitride, iron oxide, inorganic material and/or other suitable materials. The mask 100 may also include one or more reflective layers. These reflective layers may be created using materials such as silicon/molybdenum, molybdenum/beryllium, and/or other suitable materials. The mask 100 contains a die area 102, which contains one or more die patterns 104 containing features 106. The die patterns 104 may be separated by scribe lines 108 intended to be used when dicing the wafer. In some embodiments, the mask 100 includes a frame area 110 around the die area 102. The frame area 110 contains alignment marks 112 and other features that are not part of an integrated circuit such as barcodes, identification marks, logos, and text.

These alignment marks 112 are used during exposure to align masks with the wafer and are used after exposure to measure the degree of alignment of the applied masks. To measure alignment, a wafer is exposed using two or more masks, and then a metrology tool examines the shapes created by the alignment marks 112 to determine whether the mask features overlap cleanly. Commonly, this is performed using a metrology tool such as an image-based overlay metrology system or a diffraction-based overlay metrology system. The metrology results can be fed back to the photolithography system to correct some types of offset errors. However, this methodology is not a guarantee of proper device overlay throughout the die area 102. Problems can arise if the alignment marks 112 are oversized relative to device features. This leads to a lack of precision that can hide overlay errors. Additionally, alignment marks 112 cannot reveal localized overlay errors that are limited to a specific region of a die pattern 104. These localized errors may be caused the manufacturing equipment, particularly by imperfections in the lens or light source, or they may be caused by mask defects such as mask pattern misplacement or warping. These mask-based errors require a method of in-die overlay metrology if they are to be measured and possibly corrected.

Figure 2A:
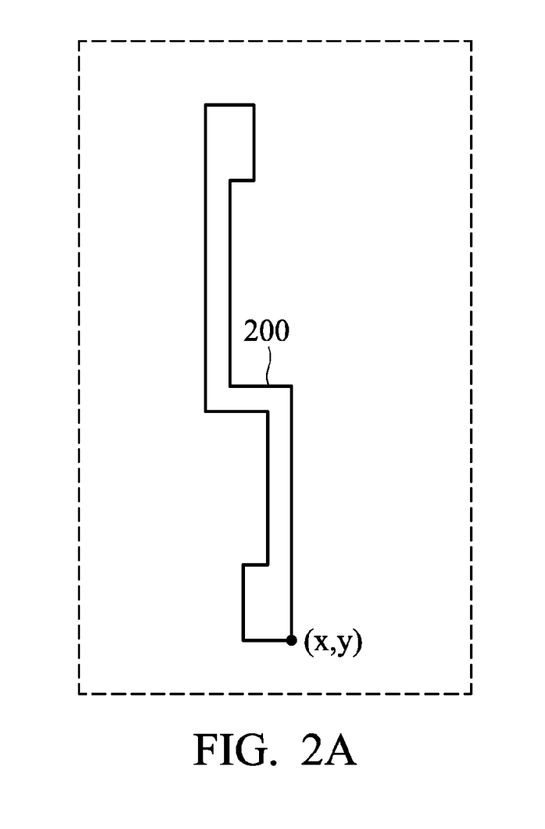
FIGS. 2a and 2b are diagrammatic top views of exemplary features of a mask according to various aspects of the present disclosure.
Figure 2B:
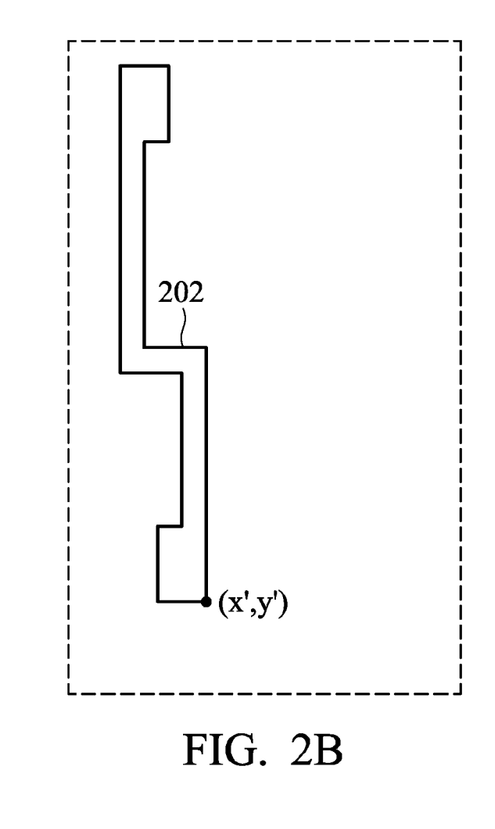

FIG. 2a and FIG. 2b are diagrammatic top views of exemplary features of a mask. FIG. 2a illustrates a circuit feature 200 contained within a mask database. The mask database contains a representation of the mask features in a predetermined mask design standard such as GDSII, OASIS, or MEBES®, a registered trademark of Applied Materials. Because the mask database contains the features as they are intended to be formed on the mask, the database can be considered the golden model. Feature 200 is intended to be printed at a location (x,y) within the die area. However, as illustrated in FIG. 2b, when a mask is created using the mask database, corresponding feature 202 is formed on the mask at location (x',y'). Feature 202 may also have a different height or width than feature 200. To detect this discrepancy and the potential overlay error, a metrology system is needed that can compare feature 202 on the mask to feature 200 in the design database. The present disclosure provides an efficient and cost effective system for intra-die overlay metrology by leveraging imaging tools and data already in place for defect inspection.

Figure 3:
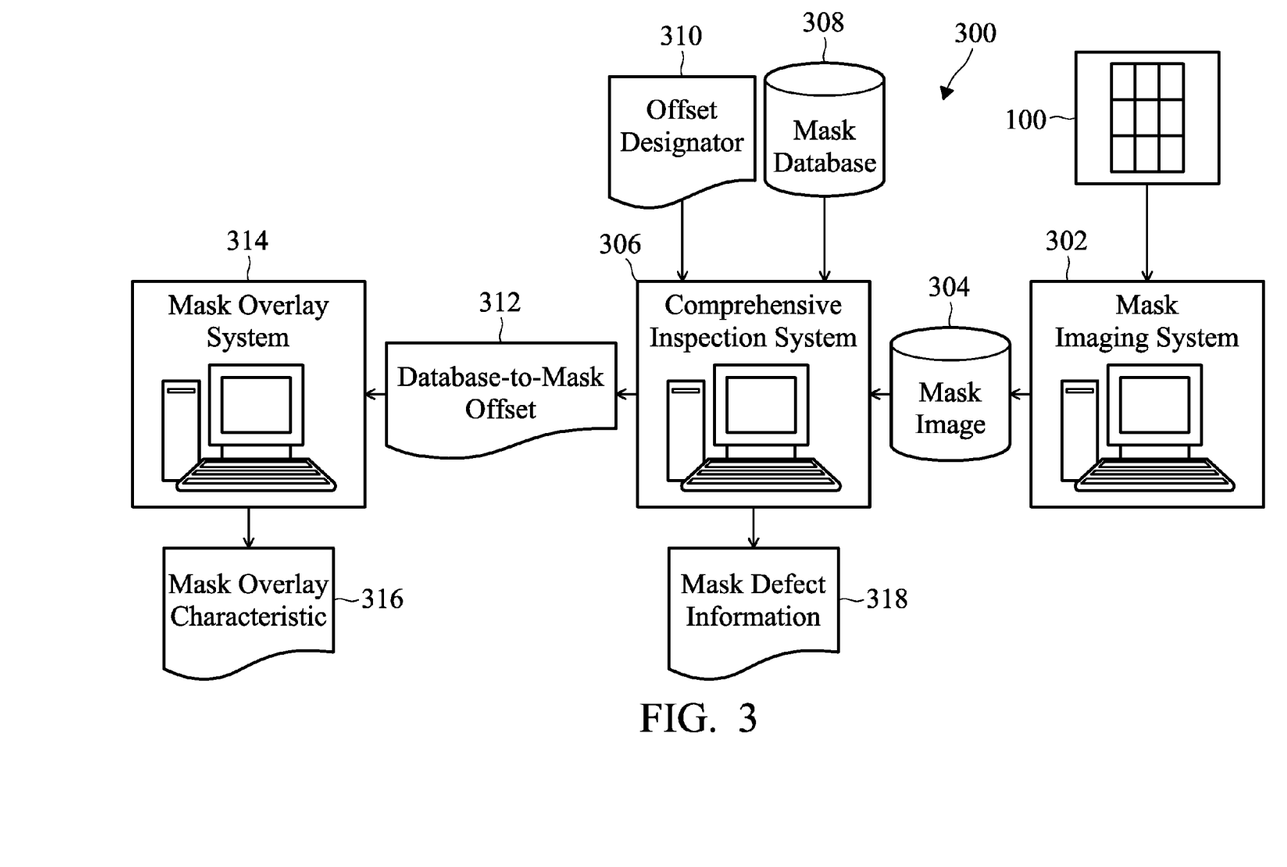
FIG. 3 is a block diagram of an embodiment of a combined overlay metrology and defect inspection system.

Such a system is described in FIG. 3, a block diagram of an embodiment of a combined overlay metrology and defect inspection system 300. The system 300 is able to both determine a mask overlay characteristic and identify mask defects unrelated to alignment by comparing a mask to its corresponding mask design database. The system 300 includes a mask imaging system 302, which captures a mask image 304, a comprehensive inspection system 306, which analyzes the mask image 304 to determine both a database-to-mask offset 312 and mask defect information 318, and a mask overlay system 314, which determines a mask overlay characteristic 316 from the offset 312. The mask imaging system 302, the comprehensive inspection system 306, and the mask overlay system 314 include computing hardware. This computing hardware can be a conventional, commercially-available computer, or any other suitable computer hardware. The computing hardware may be a general purpose or specific purpose computer and may include a processor and a memory. The memory stores a computer program that is executed by the processor and that causes the computing hardware to control the mask imaging system 302, the comprehensive inspection system 306, and the mask overlay system 314, respectively. The computing hardware is operable to perform actions including manipulating information (including manipulating information using a model), receiving information, storing information, and transferring information. In an example, the computing hardware may include multiple computers. The computing hardware may include equipment or code embedded in a process tool, such as, for example, the mask imaging system 302, the comprehensive inspection system 306, or the mask overlay system 314. The computing hardware may further include one or more user interfaces.

The mask imaging system 302 receives a mask 100, images the mask, and captures the image to produce the mask image 304. Examples of a mask imaging system 302 include an emissive microscopy mask imaging system. Emissive microscopy systems include a radiation source and an imaging sensor. The radiation source may operate at an actinic frequency (the frequency used to expose a wafer) or at an alternative frequency such deep ultraviolet (DUV) or extreme ultraviolet (EUV). Alternatively, the radiation source may be an electron beam (e-beam). The mask 100 is exposed to the radiation source and the imaging sensor measures the radiation reflected from or transmitted through the mask 100. In another common example of a mask imaging system 302, an atomic force microscopy system utilizes one or more styluses to measure mask features. The stylus is brought near to or in contact with the mask surface. Force generated between the point and the mask, even in the absence of contact, deflects the stylus. This deflection is measured in order to determine the elevation of the mask surface at the tip of the stylus. It should be noted that these are merely examples of mask imaging systems 302. The present disclosure includes other suitable imaging systems, alone and in combination.

The mask imaging system 302 records the raw values measured via the imaging sensor or the stylus, and it may also perform post processing to increase clarity, resolution, to simulate inspection in an alternate optical plane, or to highlight relevant features. The processed or unprocessed measurements are output as a mask image 304.

The comprehensive inspection system 306 receives the mask image 304, a mask database 308, and, in some embodiments, an offset designator 310. The comprehensive inspection system 306 compares the mask image 304 to the mask database 308 to determine a database-to-mask offset 312, a measure of localized variance that can lead to overlay errors in circuits manufactured utilizing the mask. Additionally, the comprehensive inspection system 306 also identifies mask defects unrelated to overlay and generates mask defect information 318. These non-alignment mask defects include errors such as protrusions, intrusions, bridges, necking, pinholes, and pinspots. Inspecting for these defects and determining mask overlay from the same mask image 304 and mask database 308 reduces the need for additional tools, method steps, and processing time. In a further embodiment, the comprehensive inspection system 306 inspects for non-alignment mask defects at the same time as the system 306 locates the features within the mask database 308 and the mask image 304. This ability to perform defect inspection while determining the database-to-mask offset 312 further reduces processing time and inspection steps.

To determine the database-to-mask offset 312, the comprehensive inspection system 306 compares features of the mask image 304 to analogous features of the mask database 308. One or more offsets 312 can then be determined from the relative placements of the features. To select where offsets 312 are calculated, the user may supply an offset designator 310. The offset designator 310 identifies one or more features within the mask database 308 or mask image 304. In an exemplary embodiment, the offset designator 310 specifies the features directly based on location, shape, or any other distinguishing characteristic. Each feature may be selected based on any number of design considerations such as whether the feature is critical to yield or located in a region critical to yield, whether the feature is a typical example of similar features, whether it is distinct or otherwise efficient to identify, or any other design consideration. In another embodiment, the offset designator 310 specifies a point location within the mask database 308 or mask image 304. A feature or features adjacent to the location are then compared to determine the database-to-mask offset 312. The point location may be selected based on any design consideration including known or suspected yield issues at the location, ease of identifying features at the location, the representative nature of nearby shapes, and the location's coincidence with a test pattern. In another embodiment, the offset designator 310 specifies an area within the mask database 308 or mask image 304. A feature or features falling within the area are compared to determine the database-to-mask offset 312. In yet another embodiment, the offset designator 310 designates a combination of specific features, point locations, and areas relative to the mask database 308, the mask image 304, or both.

After identifying one or more features within the mask database 308 and one or more corresponding features within the mask image 304, the comprehensive inspection system 306 compares the locations of the corresponding features to determine the database-to-mask offset 312 for the mask. Commonly the database-to-mask offset 312 includes multiple offset values calculated at multiple locations. The database-to-mask offset 312 may be provided to a mask overlay system 314 to determine a mask overlay characteristic 316. The mask overlay characteristic 316 provides an indicator of how mask shapes will align when printed on a wafer. By examining mask overlay characteristics for multiple masks, designers can assess and predict potential misalignment between layers. In one example, a mask overlay characteristic for a region of a mask for a layer is compared to a mask overlay characteristic for a corresponding region of a mask for an adjacent layer. The comparison reveals the degree of alignment within the regions. It may also reveal mask overlay errors, features that fail to overlap properly or that overlap unintentionally.

In addition to detecting mask overlay errors, the mask overlay characteristic 316 can be used to correct the mask, to correct the exposure process, to detect an unusable mask, or can be used as part of a quality control measure. In some cases, such as if an unacceptable offset is limited to a particular area, it is particularly cost-effective to repair a portion of a mask while retaining the rest. The characteristic 316 can be used to formulate a correction that adjusts the features within the region in order to reduce the offset. Additionally, the positioning of the mask during exposure can be adjusted using the characteristic 316. This may involve averaging or weighing multiple offsets to determine a mask alignment factor that can be applied to shift the entire mask during lithography. However, the mask overlay characteristic 316 may also indicate that the mask will not produce the desired yield, and the mask may have to be recycled. For quality control, the characteristic 316 can also be used to monitor mask production or to evaluate new mask-making technologies.

Figure 4A:
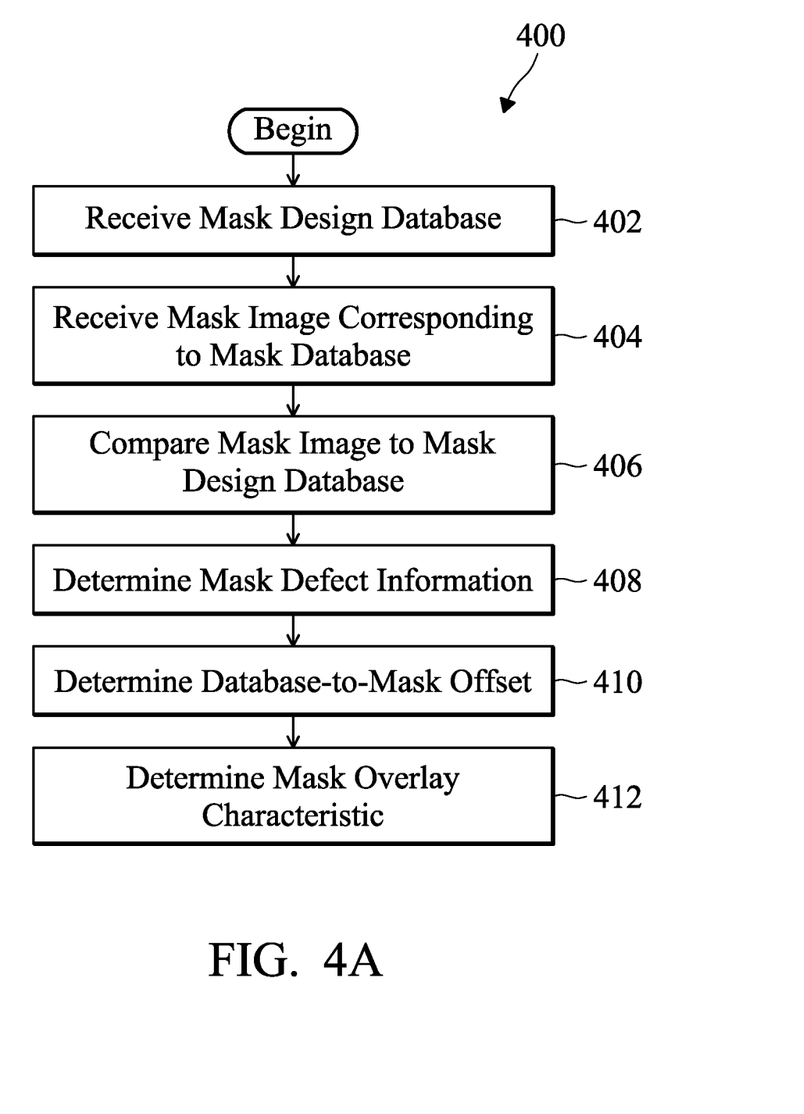
FIGS. 4a and 4b are flow charts of an exemplary method for determining an overlay factor that can be performed by the combined overlay metrology and defect inspection system of FIG. 3.

FIG. 4a is a flow chart of a method 400 for determining an overlay factor that can be performed by the combined overlay metrology and defect inspection system 300 of FIG. 3. Additional steps can be provided before, during, and after the method 400, and some of the steps described can be replaced or eliminated for other embodiments of the method. Additionally, some steps may be performed concurrently with other steps. The method begins at block 402 where a mask design database is received. At block 404, a mask image is received that corresponds to the mask design database. At block 406, the mask image is compared to the mask design database by a comprehensive inspection system 306. At block 408, the comparison is used by the comprehensive inspection system 306 to determine mask defects unrelated to alignment. At block 410, the comparison is used by a comprehensive inspection system 306 to determine a database-to-mask offset. At block 412, a mask overlay characteristic is determined based, at least in part, on the database-to-mask offset.

Figure 4B:
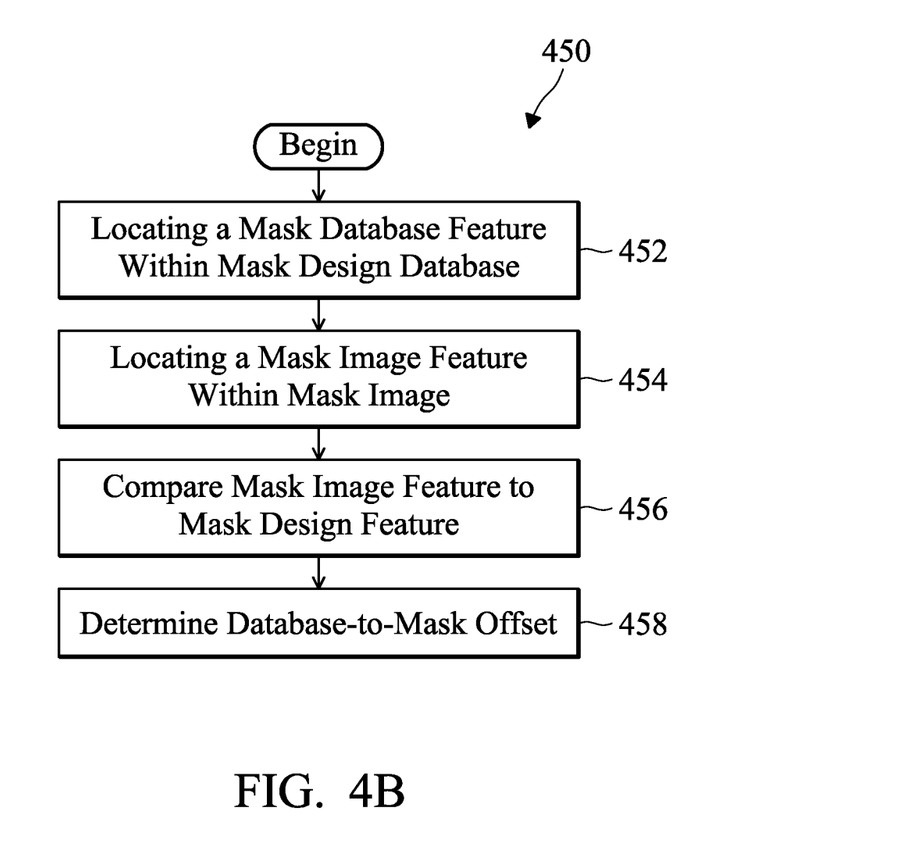

FIG. 4b is a flow chart of a further method 450 for determining an overlay factor that can be performed by the combined overlay metrology and defect inspection system 300 of FIG. 3. At block 452, a mask database feature is located within a mask design database. At block 454, a mask image feature corresponding to the mask database feature is located within the mask image. At block 456, the mask image feature is compared to the mask database feature by a comprehensive inspection system 306. At block 458, a database-to-mask offset is determined by the comprehensive inspection system 306.

Figure 5A:
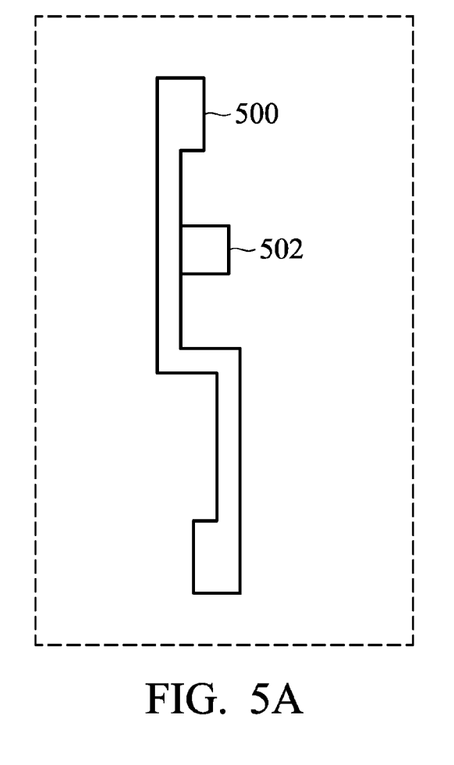
FIGS. 5a and 5b are diagrammatic top views of exemplary features of a mask according to various aspects of the present disclosure.
Figure 5B:
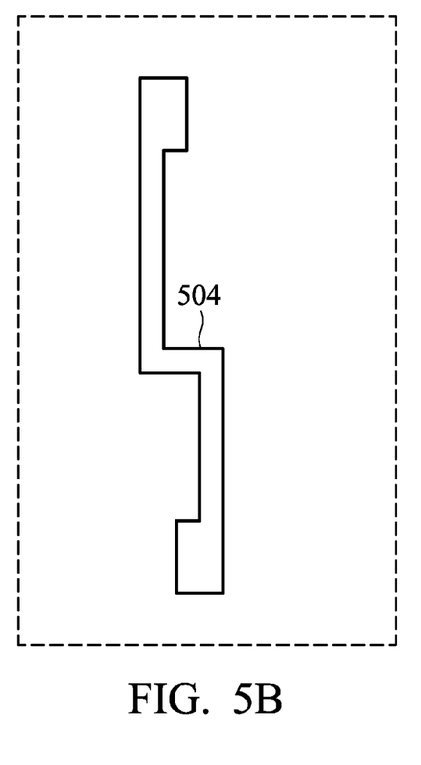

In some embodiments, a flag feature is included in the mask database that does not correspond to a feature on the mask. The flag feature can be a positive feature or a negative feature. A positive flag feature is an area of a particular mask material, such as chromium, that exists in the database but is not present in the mask. In contrast, a negative feature is an area where a material exists in the mask but is not present in the database. This flag feature creates a discrepancy that will be detected during a database-to-mask comparison, such as the comparison performed when inspecting the mask for defects. The output of the comparison facilitates rapid location of other features. These other features are then compared to determine the database-to-mask offset. FIGS. 5a and 5b are diagrammatic top views of exemplary features according to various aspects of the present disclosure. FIG. 5a illustrates a feature 500 and flag feature 502 within a mask database. For comparison, FIG. 5b illustrates a feature 504 of a mask. Feature 500 within the mask database has a corresponding feature 504 of the mask, while flag feature 502 does not have a corresponding feature within the mask. Flag feature 502 assists in locating feature 500 and feature 504, the later two of which will be used in determining a database-to-mask offset.

Figure 6:
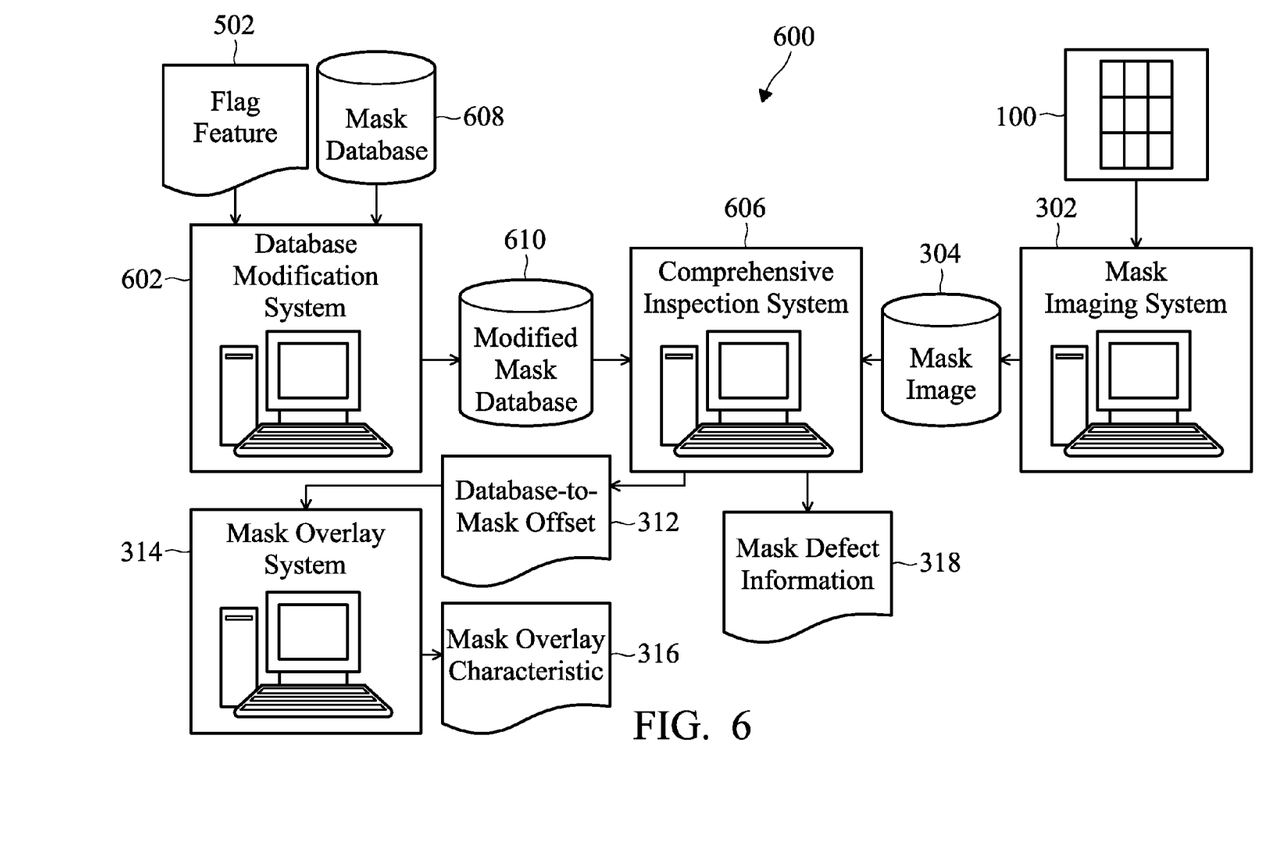
FIG. 6 is a block diagram of an embodiment of a combined overlay metrology and defect inspection system.

FIG. 6 illustrates a system that utilizes a flag feature 502 to locate feature 500 in the mask database and feature 504 of the mask. FIG. 6 is a block diagram of an embodiment of a combined overlay metrology and defect inspection system 600. The system 600 includes a mask imaging system 302, which produces a mask image 304, a database modification system 602, which adds a flag feature 502, and a comprehensive inspection system 606, which determines both a database-to-mask offset 312 and mask defect information 318. The system 600 also includes a mask overlay system 314, which determines a mask overlay characteristic 316. The mask imaging system 302, the database modification system 602, the comprehensive inspection system 606, and the mask overlay system 314 may include computing hardware such as one or more conventional, commercially-available general purpose or specific purpose computers, a processor and a memory and/or one or more user interfaces, and hardware operable to perform actions including manipulating information, receiving information, storing information, and transferring information.

As previously described, the mask imaging system 302 images a mask 100 to produce the mask image 304. The database modification system 602 receives a mask database 608 corresponding to the mask 100 and a flag feature 502. This flag feature 502 is added to the mask database to produce the modified mask database 610.

The comprehensive inspection system 606 receives the modified mask database 610 and the mask image 304. The comprehensive inspection system 606 compares the modified mask database 610 and the mask image 304 to determine a mask mismatch. A mask mismatch is a feature differences between the database, the golden model for a mask, and the mask. Because the flag feature 502 exists in the modified mask database 610 but not in the mask image 304, the mask mismatches produced by the comprehensive inspection system 606 will include the flag feature 502.

In some embodiments, the mask mismatches contain sufficient information for the comprehensive inspection system 606 to determine the location of a mask database feature and a corresponding mask image feature. The system 606 can then determine a database-to-mask offset 312 without further input. However, in alternate embodiments, the inspection system 606 cross-references the mask mismatches to the mask image 304, the mask database 608, and/or the modified mask database 610 to locate the features needed to determine the database-to-mask offset 312. Once the offset 312 is determined, the mask overlay system 314 can utilize the offset 312 to determine a mask overlay characteristic 316, an indicator of how mask features will align when printed.

The comprehensive inspection system 606 can also detect mask errors that are unrelated to mask alignment. The non-alignment defects are reported as mask defect information 318. Inspecting for defects such as protrustions, intrusions, bridges, necking, pinholes, and pinspots and determining mask overlay from the same database and mask image reduces the need for additional tools, method steps, and processing time. As inspection for non-alignment mask defects is typically performed by a defect inspection system, in some embodiments, the comprehensive inspection system 306 is integrated into a defect inspection system, either alone or with the mask imaging system 302. This combination allows the tests to be performed without the need for additional equipment. For efficiency, the comprehensive inspection system 606 can also be combined with the database modification system 602 and/or the mask overlay system 314. In further embodiments, the comprehensive inspection system 606 can locate the flag feature 502, determine the database-to-mask offset 312 and determine mask defect information 318 simultaneously. This can greatly improve efficiency and eliminate the need for additional inspections.

Figure 7:
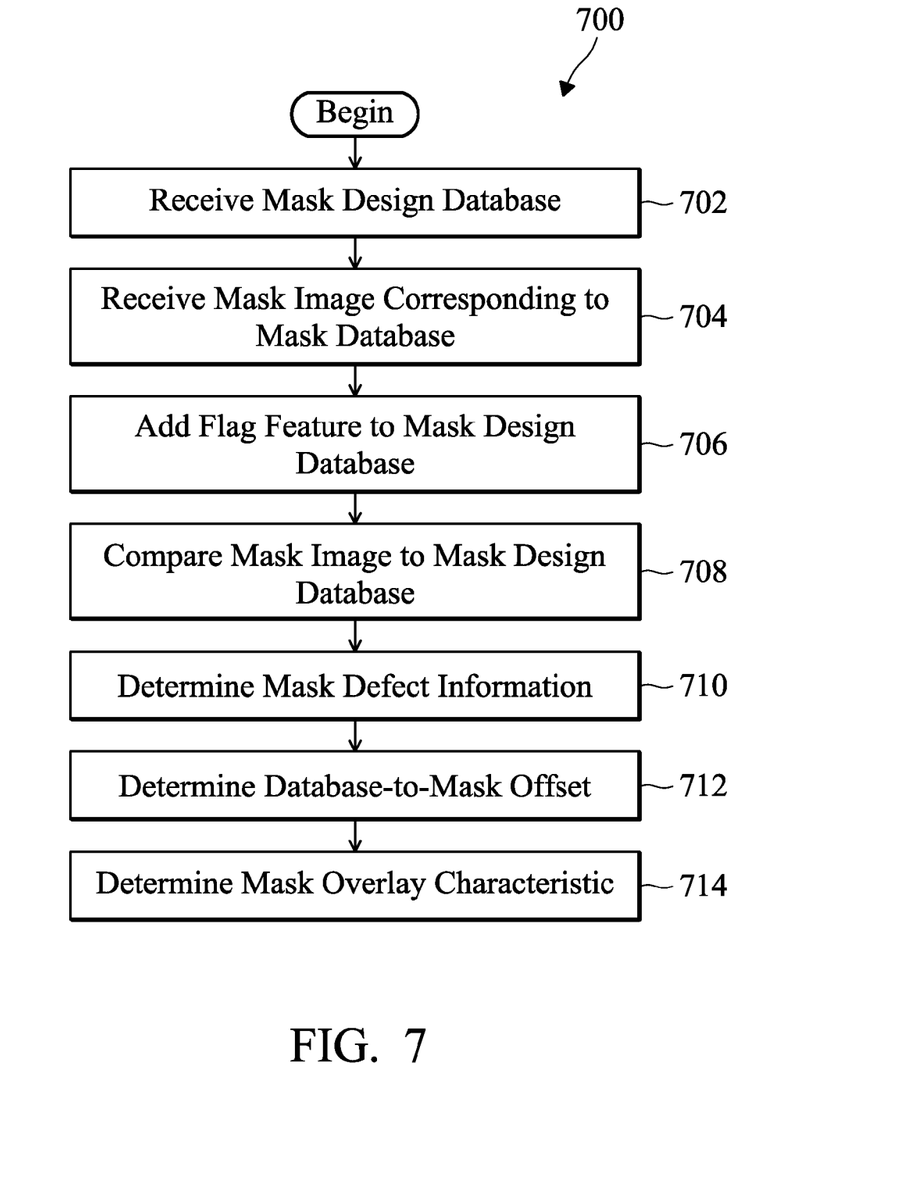
FIG. 7 is a flow chart of an exemplary method for determining an overlay factor that can be performed by the combined overlay metrology and defect inspection system of FIG. 6.

FIG. 7 is a flow chart of a method 700 for determining an overlay factor that can be performed by the comprehensive inspection system 600 of FIG. 6. Additional steps can be provided before, during, and after the method 700, and some of the steps described can be replaced or eliminated for other embodiments of the method. Additionally, some steps may be performed concurrently with other steps. Method 700 begins at block 702 where a mask design database is received. In block 704, a mask image is received that corresponds to the mask database. In block 706, a flag feature is added to the mask database to create a modified mask database. In block 708, the modified mask database is compared to the mask image. This will locate discrepancies including the one caused by the flag feature. In block 710, a subset of the discrepancies correlating to non-alignment mask defects is identified, and mask defect information is determined. In block 712, the discrepancies are used to determine a database-to-mask offset. At block 714, a mask overlay characteristic is determined based, at least in part, on the database-to-mask offset.

The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

Thus, the present invention provides a method and apparatus for performing overlay metrology and mask defect inspection utilizing a single inspection tool. In one embodiment, the method includes: receiving a mask design database, wherein the mask design database corresponds to a mask and has a die area, and wherein the mask design database contains a mask database feature disposed within the die area; receiving a mask image corresponding to the mask; comparing the mask image to the mask design database to determine mask defect information corresponding to a mask defect not related to mask alignment using a comprehensive inspection system; comparing the mask image to the mask design database to determine a database-to-mask offset using the comprehensive inspection system; and determining a mask overlay characteristic from the database-to-mask offset.

In a further embodiment, the apparatus comprises: a computer readable medium that stores a plurality of instructions for execution by at least one computer processor, wherein the instructions are for: receiving a first database-to-mask mismatch wherein the database-to-mask mismatch comprises an identification of a miscorrespondence between a mask design database corresponding to a mask and a mask image corresponding to the mask; determining mask defect information corresponding to a mask defect not related to mask alignment from the first database-to-mask mismatch; receiving a second database-to-mask mismatch comprising an identification of a miscorrespondence between the mask design database and the mask image; and determining a database-to-mask offset from the second database-to-mask mismatch.

In yet another embodiment, the apparatus comprises: a computer readable medium that stores a plurality of instructions for execution by at least one computer processor, wherein the instructions are for: receiving a mask design database, wherein the mask design database corresponds to a mask, contains a die area, and contains a mask database feature disposed within the die area, the mask database feature having a first location; receiving a flag feature that does not correspond to the mask and which is configured to assist in determining the first location of the mask database feature; adding the flag feature to the mask design database to produce a modified mask design database; and providing the modified mask design database.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a mask design database, wherein the mask design database corresponds to a mask and has a die area, and wherein the mask design database contains a mask database feature disposed within the die area;
receiving a mask image corresponding to the mask;
comparing the mask image to the mask design database to determine mask defect information corresponding to a mask defect not related to mask alignment using a comprehensive inspection system;
comparing the mask image to the mask design database to determine a database-to-mask offset using a computer of the comprehensive inspection system;
determining a mask overlay characteristic from the database-to-mask offset; and
determining a mask alignment factor from the mask overlay characteristic, wherein the mask alignment factor is for use in adjusting the mask position during photolithography.

2. The method of claim 1, wherein the comparing the mask image to the mask design database to determine the database-to-mask offset includes:
locating the mask database feature, wherein the mask database feature has a first location;
locating a mask image feature within the mask image, wherein the mask image feature corresponds to the mask database feature and has a second location; and
comparing the first location of the mask database feature to the second location of the mask image feature to determine the database-to-mask offset.

3. The method of claim 2, further comprising supplying an offset designator to the comprehensive inspection system,
wherein the offset designator is configured for at least one of locating the mask database feature and locating the mask image feature; and
wherein the at least one of locating the mask database feature and locating the mask image feature is performed using the offset designator.

4. The method of claim 2, wherein the mask database further contains one or more dies disposed within the die area, and wherein the mask database feature is disposed within the one or more dies.

5. The method of claim 2, further comprising adding a flag feature to the mask design database,
wherein the flag feature is configured for at least one of locating the mask database feature and locating the mask image feature;
wherein the flag feature does not correspond to the mask; and
wherein the at least one of locating the mask database feature and locating the mask image feature is performed using the flag feature.

6. The method of claim 1, wherein receiving the mask image corresponding to the mask comprises receiving the mask at a mask imaging system and imaging the mask using the mask imaging system to produce the mask image.

7. The method of claim 1, further comprising determining a mask correction from the mask overlay characteristic, wherein the mask correction is for use in modifying a region of the mask described by the mask overlay characteristic.

8. The method of claim 7, further comprising modifying a region of the mask based on the mask correction to reduce overlay error.

9. The method of claim 1, wherein the mask overlay characteristic is a first mask overlay characteristic and corresponds to a first mask, the method further comprising:
receiving a second mask design database, wherein the second mask design database corresponds to a second mask;
receiving a second mask image corresponding to the second mask;
comparing the second mask image to the second mask design database to determine a second database-to-mask offset using the comprehensive inspection system; and
determining a second mask overlay characteristic from the second database-to-mask offset; and
comparing the first mask overlay characteristic to the second mask overlay characteristic to determine a mask overlay error.

10. An apparatus comprising:
a non-transitory computer readable medium that stores a plurality of instructions for execution by at least one computer processor, wherein the instructions are for:
receiving a first database-to-mask mismatch wherein the first database-to-mask mismatch comprises an identification of a miscorrespondence between a mask design database corresponding to a mask and a mask image corresponding to the mask;
determining mask defect information corresponding to a mask defect not related to mask alignment from the first database-to-mask mismatch;
receiving a second database-to-mask mismatch wherein the second database-to-mask mismatch comprises an identification of a miscorrespondence between the mask design database and the mask image; and
determining a database-to-mask offset from the second database-to-mask mismatch.

11. The apparatus of claim 10, wherein the instructions for receiving the second database-to-mask mismatch include instructions for:
receiving the mask design database;
locating a mask database feature within the mask design database;
receiving the mask image;
locating a mask image feature within the mask design database, the mask image feature corresponding to the mask database feature; and
comparing the mask database feature to the mask image feature to determine the second database-to-mask mismatch.

12. The apparatus of claim 11, the computer readable medium including further instructions for receiving an offset designator, and wherein the instructions for at least one of locating a mask database feature and locating a mask image feature are configured to utilize the offset designator.

13. The apparatus of claim 11, wherein the die area of the mask design database contains one or more dies, and wherein the mask database feature is disposed within the one or more dies.

14. The apparatus of claim 10, the computer readable medium including further instructions for determining a mask overlay characteristic from the database-to-mask offset.

15. The apparatus of claim 14, wherein the mask overlay characteristic is a first mask overlay characteristic and corresponds to a first mask, and wherein the computer readable medium includes further instructions for:

receiving a third database-to-mask mismatch wherein the third database-to-mask mismatch comprises an identification of a miscorrespondence between a second mask design database corresponding to a second mask and a second mask image corresponding to the second mask;

determining a second database-to-mask offset from the third database-to-mask mismatch;

determining a second mask overlay characteristic from the second database-to-mask offset; and     comparing the first mask overlay characteristic to the second mask overlay characteristic to determine a mask overlay error.

16. The apparatus of claim 14, the computer readable medium including further instructions for determining a mask alignment factor from the mask overlay characteristic, wherein the mask alignment factor is for use in adjusting the mask position during photolithography.

17. The apparatus of claim 14, the computer readable medium including further instructions for determining a mask correction from the mask overlay characteristic, wherein the mask correction is for use in modifying a region of the mask described by the mask overlay characteristic.

18. An apparatus comprising:

a non-transitory computer readable medium that stores a plurality of instructions for execution by at least one computer processor, wherein the instructions are for:

receiving a mask design database, wherein the mask design database corresponds to a mask, contains a die area, and contains a mask database feature disposed within the die area, the mask database feature having a first location;

receiving a flag feature that does not correspond to the mask and which is configured to assist in determining the first location of the mask database feature;

adding the flag feature to the mask design database to produce a modified mask design database; and         providing the modified mask design database to a comprehensive inspection system.

19. The apparatus of claim 18, wherein the mask design database contains one or more dies, and wherein the mask database feature is disposed within the one or more dies.

\* \* \* \* \*